United States Patent [19]

Shates

[11] Patent Number: 5,749,966
[45] Date of Patent: May 12, 1998

[54] PROCESS FOR DEPOSITING DIAMOND AND REFRACTORY MATERIALS

[75] Inventor: Steven C. Shates, Santa Clara, Calif.

[73] Assignee: Modular Process Technology Corp., San Jose, Calif.

[21] Appl. No.: 324,074

[22] Filed: Oct. 14, 1994

Related U.S. Application Data

[62] Division of Ser. No. 62,975, May 14, 1993, Pat. No. 5,387,288.

[51] Int. Cl.⁶ ................................................ C30B 25/02
[52] U.S. Cl. .................... 117/79; 117/82; 118/723 MW; 118/723 MP; 118/723 ME
[58] Field of Search .............. 117/79, 82; 118/723 MW, 118/723 MP, 723 ME; 423/446; 427/249, 255.6

[56] References Cited

U.S. PATENT DOCUMENTS

| | | | |
|---|---|---|---|
| 4,958,590 | 9/1990 | Goforth | 118/723 MW |
| 5,230,740 | 7/1993 | Pinneo | 118/723 MW |
| 5,234,502 | 8/1993 | Mochizuki et al. | 118/723 MW |
| 5,449,412 | 9/1995 | Pinneo | 118/723 ME |

FOREIGN PATENT DOCUMENTS

0316998  1/1991  Japan.

*Primary Examiner*—Felisa Garrett

[57] ABSTRACT

An improved plasma enhanced chemical vapor deposition (CVD) reactor is provided for the synthesis of diamond and other high temperature materials such as boron nitride, boron carbide and ceramics containing oxides, nitrides, carbides and borides, or the like. An aspect of the present method enables a plasma to substrate distance to be optimized for a given surface. This has been found to enable a substantially uniform thin film coating of diamond or like material to be deposited over a substrate.

10 Claims, 5 Drawing Sheets

|  | Process | | |
|---|---|---|---|
|  | A | B | C |
| Gas Flow SCCM  $H_2$ | 1000 | 1000 | 0 |
| $CH_4$ | 7.5 | 15.0 | 4.0 |
| $O_2$ | 2.5 | 1.0 | 0.0 |
| Ar | 0.0 | 0.0 | 40.0 |
| Substrate Temp, °C | 950 | 650 | 250 |
| Pressure, Torr | 50 | 50 | 0.050 |
| Microwave Power, Watts | 2000 | 2000 | 0 |
| RF Bias Power, Watts | 0 | 0 | 100 |
| Time, Hrs | 10 | 10 | 3 |

| Process | Type of Film Deposited |
|---|---|
| A | Polycrystalline Diamond |
| B | Nanocrystalline Diamond |
| C | Diamond Like Carbon (DLC) |

PROCESS FOR DEPOSITING DIAMOND AND REFRACTORY MATERIALS

This application is a divisional of application Ser. No. 08/062,975 filed on May 14, 1993 now U.S. Pat. No. 5,389,388.

BACKGROUND

The field of the present invention relates generally to a plasma enhanced chemical vapor deposition (CVD) reactor. In particular, the field of the present invention relates to a plasma CVD device suitable for the synthesis of materials such as diamond, boron nitride, boron carbide, ceramics containing oxides, nitrides, carbides and borides, or the like, and for the deposition of a uniform thin film layer of gallium nitride, or the like, over a substrate.

Diamond and other high temperature materials such as boron nitride, boron carbide, and ceramics containing oxides, nitrides, carbides and borides are finding increasing uses because of their high temperature and wear resistance, and high strength. In particular, there is increasing demand for coatings of these materials to be deposited on ordinary materials to impart wear resistance, abrasion resistance, and high temperature resistance.

A conventional plasma enhanced CVD reactor employs microwaves to produce a stable plasma. The apparatus consists of a microwave generator, a tuning element, a waveguide, and a quartz tube. The quartz tube is passed through the waveguide, and a substrate is placed inside the quartz tube in the region where it passes through the waveguide. Suitable gases are introduced into the tube, for example in the case of diamond synthesis, a mixture of methane and hydrogen. The plasma is formed inside the tube by the microwave radiation, and a diamond layer is deposited on the substrate surface. The substrate size is limited to very small sizes by the physical dimensions of the microwave cavity.

A second conventional technique also employs microwaves to produce stable plasmas. The apparatus consists of a microwave cavity, a vacuum chamber connected to the microwave cavity by means of a microwave transparent window, and a microwave generator and waveguide to introduce microwaves into the microwave cavity. A magnetic field is generated by magnets external to the microwave cavity. The magnets have a polarity and magnitude suitable to create an electron cyclotron resonance (ECR) condition within the chamber. This technique has a disadvantage in that the pressure of the gas is limited to 0.5 torr or less by the necessity of maintaining the electron cyclotron resonance condition. Accordingly, the deposition rates of diamond materials are very low.

A third type of conventional plasma reactor also employs microwaves to produce stable plasmas. The type of plasma reactor is represented by U.S. Pat. No. 4,940,015. The apparatus consists of a microwave cavity, a vacuum chamber connected to the microwave cavity by means of a microwave transparent window, and a microwave generator and waveguide to introduce microwaves into the microwave cavity. The chamber is of suitable dimensions so as to create a cavity resonance condition for the efficient absorption of microwave energy by the plasma. However, it is not possible to move the plasma relative to the substrate surface, and hence the substrate size is limited.

Conventional methods of coupling an E field into a microwave cavity such as is shown in U.S. Pat. No. 4,866,346 employ a mode coupler. See for example, the '346 patent at col. 7, lines 42–43. A conductive rod passes from an input waveguide into a cylindrical cavity, characterized as an output waveguide. The conductive rod passing between the waveguides is a mode coupler. This configuration has the disadvantage of limiting substrate size. Also, the mode coupler exhibits inferior plasma stability. Consequently, the plasma cannot be closely controlled to form a uniform coating of a diamond or refractory material.

As will be explained, the present invention uses an antenna radiator, rather than a microwave coupler, for radiating an E field of maximized intensity into a stable microwave cavity. This provides an E field of maximized intensity which produces a plasma that can be closely controlled to precise tolerances.

It is not possible with conventional plasma enhanced CVD reactors to control the plasma to the degree necessary for certain new semiconductor processing applications such as, for example, deposition of diamond films. It would be advantageous to grow single crystal thin film diamonds in a CVD process for electronic applications. The presently known conventional plasma enhanced CVD techniques described above are unable to produce single crystal diamond films which are large enough for electronic devices.

Single-crystal thin film diamonds promise broad utility in electronic applications. Diamond materials for electronics consist of a single crystal structure and contain doping materials to make them semiconductive.

A diamond material is unique in that it has higher thermal conductivity than any other material at room temperature and above. Thus, diamond circuits could be more stable than conventional semiconductor circuits and remove accumulated heat faster. Another advantageous property of diamond is its large energy band gap, 5.45 electron volts, as compared to only 1.1 electron volts for silicon.

The large band gap of a diamond would enable it to operate at extremely high voltages and at high currents. Diamond electronic devices also can operate at high frequencies. A diamond device could run at speeds of 300 GHz as opposed to 10 MHz for the device that currently powers the IBM PC-AT.

The foregoing properties enable electronic devices made with diamond to work faster, withstand more power and fit closer together than current devices. This would also mean that electronic circuits based upon diamond materials could form the basis for extremely high-speed computing devices. Because diamond is harder and more durable than any other semiconducting material, diamond circuits will resist harsh environments that would melt or corrode existing semiconductors.

The use of diamonds in electronics is currently limited by the inability of conventional plasma enhanced CVD devices to produce uniform, thin film diamond coatings in sufficient quantity over a large enough area to make a diamond based electronic device commercially practical.

Conventional plasma enhanced CVD devices have limitations in producing diamond coatings which arise from their inability to precisely control the plasma with respect to the substrate being coated. The nature of the plasma depends upon many independent variables such as electron concentration, electron-energy distribution, gas density and so forth. It has not been possible with conventional plasma enhanced CVD devices to control these variables to a sufficient degree to produce a single crystal diamond coating over a large wafer in commercially feasible quantities. Conventional devices also lack the ability to control the plasma to the extent necessary to produce single-crystal diamond films with sufficient uniformity to be used in commercial quantities.

Another major drawback of current CVD deposition techniques is the requirement for abrasive treatment of substrate surfaces prior to deposition to promote nucleation and growth of continuous polycrystalline diamond layers. Although bias enhanced nucleation has been attempted, it is not apparent that this technique can be applied to non-conducting substrates.

Therefore, what is needed is an improved plasma enhanced CVD apparatus which is capable of optimizing the plasma to substrate contact to the degree necessary to provide diamond synthesis in commercial quantities.

What is also needed is an improved plasma enhanced CVD reactor capable of producing single crystal thin film diamond with requisite uniformity and in wafers large enough to be commercially practicable for electronic devices.

It would also be advantageous to provide an improved plasma enhanced CVD reactor capable of rapid thermal processing for producing large quantities of uniform thin film coatings of materials such as gallium nitride or the like over substrates at a greater rate than was previously possible.

What is also needed is a method for forming a diamond coating or the like which contains as an integral step within the same system, a process for forming a nucleation layer on which the diamond will grow by itself. What is also needed is a process for forming a nucleation layer, integral with a system for forming a diamond coating, wherein the process for forming a nucleation layer does not rely on the use of substrate bias and is applicable to non-conducting substrates, as well as to conducting substrates.

It would also be advantageous to incorporate the process for forming a nucleation layer integrally with the same system for creating a diamond layer in order to further enhance diamond growth and to eliminate the need for providing two separate systems, one for creating a nucleation layer, as a base for diamond growth, and another system for depositing the diamond coating.

SUMMARY

In order to overcome the above-discussed disadvantages of known plasma enhanced CVD reactors, one aspect of the present invention provides plasma CVD reactor which has a coupling antenna rotatable about a desired axis of rotation with at least two degrees of freedom to direct the stable plasma to move about the substrate surface over a larger area and with greater controllability than was previously possible. This enables the diameter of a diamond deposition to be approximately equal to the plasma diameter for each point to which the plasma is directed as the plasma is moved across the target substrate. A means are provided for swiveling the coupling antenna about an axis of rotation so that it moves with at least two degrees of freedom with respect to a target surface. The antenna can also be pivoted as well as swiveled in order to make the plasma ball scan the surface of any substrate to be coated. Accordingly, this aspect of the present invention is capable of producing a coating which is of uniform thickness over a greater area of substrate surface than was previously possible.

A device according to one aspect of the present invention is capable of providing a uniform thin film deposition of diamond or other material which is equal approximately to the locus of points defining an optimal plasma to substrate contact as the plasma is moved over the substrate. A plasma enhanced CVD reactor according to this aspect of the present invention is capable of producing a wafer or coating having a closely controlled uniform thickness at least 4 inches (10 centimeters) in diameter. This produces a wafer of approximately 75 $cm^2$. Previously, it was possible to produce a diamond wafer or coating having a uniform thickness over an area of only about 1.5 cm in diameter. Thus, a plasma enhanced CVD reactor incorporating the present invention is able to produce a diamond coating of uniform thickness over fifty times the area that was possible in the prior art.

For example, U.S. Pat. No. 4,940,015, at column 7, line 48 and column 8, line 14, teaches that a diamond film of 3 inches in diameter may be formed on the surface of the silicon substrate. However, the coating performed by U.S. Pat. No. 4,940,015 is not uniform. Thus, the coating must be subjected to further expensive processing steps in order to provide a uniform thickness to make a functional electronic device. A layer exhibiting a nonuniform, uncontrolled thickness is useless for semiconductor applications.

According to one aspect of the present invention, the coupling antenna is movable in at least two degrees of freedom. Therefore, the antenna is capable of bringing the plasma ball in a highly controlled, intimate contact with the substrate surface. It will be appreciated that another aspect of the present invention provides a means for optimizing the plasma to substrate distance over all portions of a substrate. This also enables a material such as diamond to be grown uniformly over a greater area than was previously possible. Means are provided for adjusting the angle of rotation of the antenna automatically to optimize the plasma to substrate distance over a locus of points defining the entire substrate surface to be coated. Note that this optimization of plasma to substrate distance is capable of providing a diamond coating of a uniform thickness over any type of substrate.

The substrate is not limited to a planar surface as in conventional techniques. Means are also provided for moving the substrate holder up or down with respect to the antenna, thereby further increasing control of the plasma over a larger scanable area of a substrate surface. It has been found that the substrate holder can be moved in a vertical direction with respect to the antenna without disturbing the resonance of the microwave cavity. This aspect of the present invention has the advantage of greatly increasing the coating rate of a diamond film while at the same time expanding the area coated with a uniform coating to over fifty times that of known techniques.

In accordance with another aspect of the present invention, the base of the plasma chamber consists of a water-cooled window comprising a material such as quartz which is transparent to visible light. This enables a lamp array disposed beneath the plasma chamber to irradiate and to heat up a target substrate from beneath. The use of the lamp to heat the bottom surface of the substrate may be used to create a nucleation layer which facilitates diamond growth on the top of the substrate. For example, silicon carbide can be deposited by plasma enhanced CVD on the top of a substrate heated by the lamp array. The heated silicon carbide forms a nucleation layer which enhances the growth of the diamond layer to be deposited on top of the silicon carbide layer. The use of the lamp array to irradiate the substrate from beneath increases the rate of thermal processing and has the advantage of enabling additional layers to be deposited by the plasma on the top surface of the substrate in a shorter time than was previously possible.

The inclusion of the lamp array for heating the substrate has an additional advantage over conventional plasma enhanced CVD devices in that it eliminates electrical interference with the plasma. In conventional plasma enhanced CVD reactors, the back side or underneath surface of the substrate or wafer is heated by an inductive heating process. This has the disadvantage that the power supply for the inductive heating must be carefully isolated from the substrate in order to eliminate any electrical interference which could adversely affect the plasma. Also, conventional CVD reactors incorporating inductive heating must be carefully shielded or must incorporate additional features to screen the substrate from electrical interference. This adds considerably to the cost of such a reactor.

A further advantage of this aspect of the invention is that the lamp array enables a nucleation layer to be provided nonabrasively on a substrate in the same system for creating a diamond coating. The formation of the nucleation layer is thus fully integrated in the same system for creating the diamond coating. This completely eliminates the need for two separate systems, one for creating the nucleation layer and another system for creating the diamond coating. This also achieves a tremendous savings in cost by eliminating an entire system for creating a nucleation layer and also greatly facilitates the time needed to create a diamond coating.

As a further advantage of this aspect of the invention, the nucleation layers are created without the need for applying a bias to a substrate and thus, this aspect of the invention can be employed for creating a nucleation layer on nonconductive substrates.

BRIEF DESCRIPTION OF THE DRAWINGS

These and other advantages of the present invention may be appreciated from studying the following detailed description of the presently preferred exemplary embodiment together with the drawings in which.

DETAILED DESCRIPTION

Figure 1:
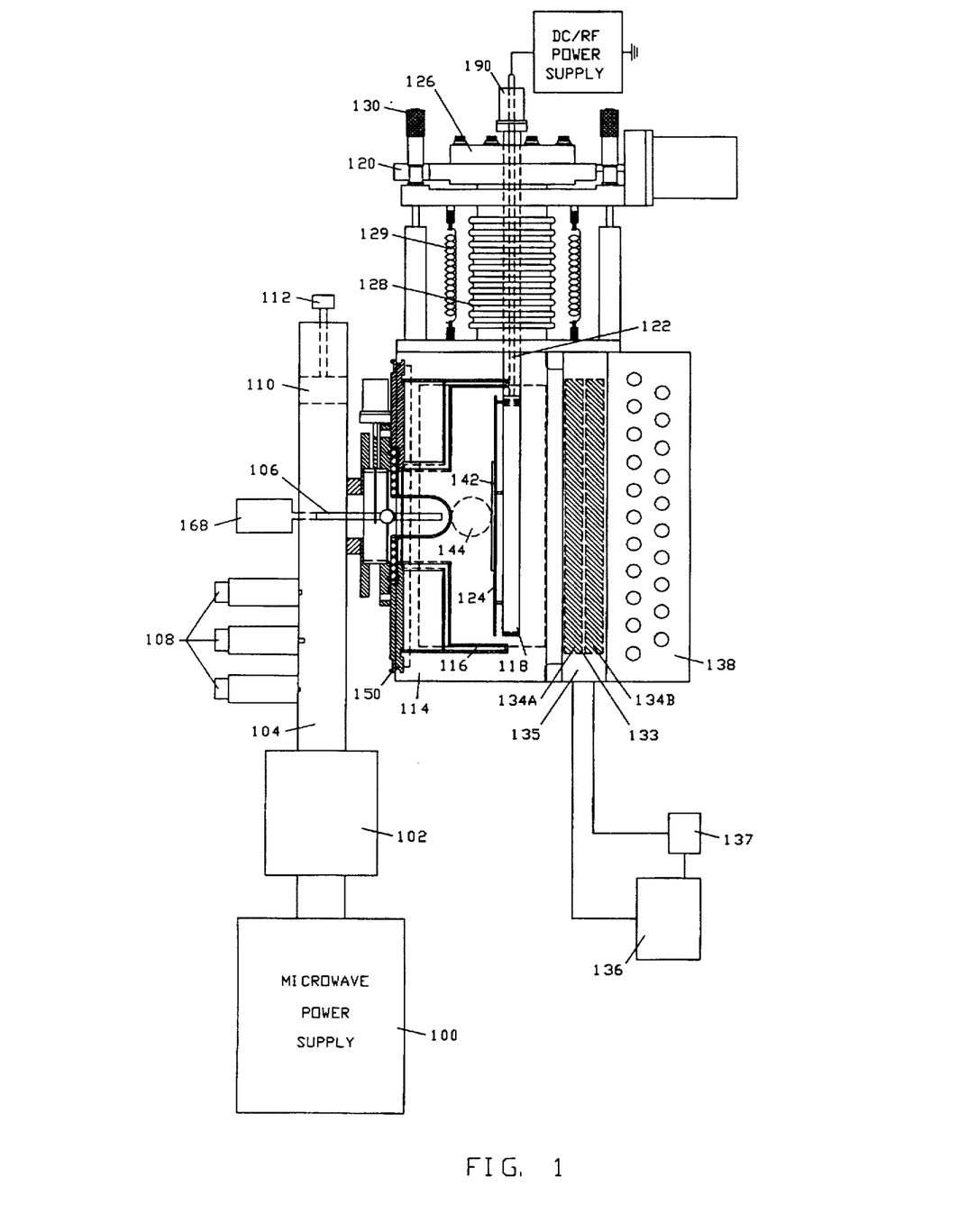
FIG. 1 is an overall side view of a first embodiment according to the present invention.

Referring to FIG. 1, the apparatus according to one aspect of the present invention provides an improved plasma enhanced CVD apparatus whereby layers of diamond, boron nitride, boron carbide, and ceramics containing oxides, nitrides, carbides and borides, as well as epitaxial films for semiconductor device applications, such as gallium nitride, or the like, can be deposited with closely controlled, uniformed thickness on suitable surfaces using a high pressure microwave plasma.

A microwave generator 100 is provided for creating radio frequency in the microwave region. The microwave generator 100 is typically a magnetron with an output power of approximately 6-30 kW. This generates microwaves in a range of 0.8-3 GHz and above. This is the accepted industry standard for plasma enhanced CVD processing. The microwave generator 100 is operatively connected to the circulator 102. The circulator 102 is a commercially available circulator such as made by Philips Corporation. Circulator 102 comprises a conventional means for phase shifting the reflected radiation which is reflected back toward the microwave generator through the non-impedance matched load.

The circulator 102 is connected to a rectangular waveguide 104. The rectangular waveguide 104 receives microwaves from the circulator 102. A three stub tuner 108 comprises three metallic cores which can selectively impinge into the rectangular waveguide 104. The metal cores of the three stub tuner 108 are adjustable to selectively place a complex reactance into the rectangular waveguide 104. Thus, the three stub tuner 108 provides a means for impedance matching the microwave frequency into the load. This allows precise impedance matching of the load to the source. Once the three stub tuner has been adjusted to impedance match into the load, it can be locked in a particular configuration to provide a constant impedance matching function.

The rectangular waveguide 104 is further provided with a sliding short 110 which makes electrical contact to the interior of the waveguide 104. The sliding short 110 is provided with an adjusting arm 112. In accordance with known techniques, the distance between the sliding short 110 and antenna 106 can be lengthened or shortened in order to vary the wavelength of the microwave energy traveling through the waveguide. The sliding short 110 moves in a horizontal direction as shown by the arrows in FIG. 1. A microprocessor (not shown) adjusts the sliding short 110 in accordance with well-known techniques in order to optimize the wavelength for the substance being coated in the process chamber 114.

The three stub tuner 108 comprises a plurality of plungers and is similar in function to an E-H tuner. A metal core is inserted into each plunger and can be selectively inserted into the waveguide at various positions. This enables the reflection power to the power source to be reduced by matching the source impedance to the entire load impedance.

A process chamber 114 is constructed of a suitable material such as stainless steel and is arranged in a cylindrical or rectangular shape. The process chamber 114 includes means for cooling the chamber surfaces. For example, the process chamber 114 in a preferred embodiment is of double walled construction. The cavity 116 is preferably filled with water or other coolant to provide efficient cooling of the process chamber.

A quartz ring support fixture 118 is attached to a motor driven stage 120. The quartz ring support fixture 118 is introduced into the process chamber 114 through one of the chamber sides. A metallic rod 122 preferably made of molybdenum, passes through the quartz ring support fixture 118 to make an ohmic contact to a metal substrate holder 124. The substrate holder 124 is disposed on the quartz ring support fixture 118. The metallic rod 122 is connected through a vacuum seal 126 to an external HF, RF, or DC power supply. The metallic rod 122 also provides means for rotating substrate holder 124 by actuator 190. The power supply provides a positive or negative bias to the substrate holder which can selectively vary the intensity of electron or ion bombardment in accordance with well-known techniques.

In a preferred embodiment, a 13.56 MHz RF power supply provides substrate bias or potential enhancement of diamond nucleation. The RF power supply has been found to be useful as means for providing initial nucleation with faster growth rate and uniformity. In addition, the RF power supply also provides a convenient means for microwave plasma ignition. It has been found that a plasma easily can be ignited with the microwave power under 200 W. The quartz ring support 118 passes through metallic bellows 128. The metallic bellows 128 also provide means for selectively varying the position of the quartz ring support fixture 118 within the process chamber 114. The metallic bellows 128 in conjunction with springs 129 also provide means for centering and leveling the substrate holder in the plasma chamber. Micrometer screws 130 aid in precisely positioning the substrate holder.

A rectangular gate valve is fixed to one side of the process chamber 114 for the purpose of introducing and withdrawing substrates and substrate holders from the process chamber in a well-known manner. Other sides of the process chamber 114 are used to introduce gases into the chamber and to affix various pressure gauges, site ports, and other instruments in accordance with techniques which are well-known. The process chamber access ports, also located on the process chamber sides, permit plasma diagnostics and in-situ surface analysis to be performed. In a preferred embodiment, the system is fully automated, utilizing a microprocessor to provide process control, data process collection, analysis and display. Once the substrate is loaded, the system provides complete control in real time process including gas, vacuum, pressure, plasma formation, temperature and substrate position. The motorized wafer stage is also microprocessor controlled in accordance with techniques which are well-known and is used to position automatically the substrate.

The base of the process chamber 114 is sealed by a quartz window 133 comprising two substantially adjacent quartz plates 134a, 134b. The window 133 may be fabricated from any material which is transparent to visible light. The preferred material is quartz. The quartz plates 134a, 134b are separated by an interstitial space 135 which is cooled by water or other coolant material circulating therein from a coolant reservoir 136.

The interstitial spaces 135 are optimized to maximize the transmission of lamp radiation and to maximize heat transfer to the coolant. The practical limit for the interstitial space 135 is greater than 0.001 in. and less than 0.010 in.

A conventional pumping means 137 circulates coolant throughout the interstitial space 135. The interstitial space 135 of an optimal width to accommodate a fluid flow rate which prevents the formation of thermal discontinuities or hot spots on the quartz plates 134a, 134b. This facilitates the heating of the substrate 142 to a greater degree than was previously possible and increases the rate of growth of a nucleation layer on the substrate.

In a conventional plasma CVD process, the nucleation layer must be formed in a separate system, created specifically for that purpose. Typically, the substrate is abrasively treated, such as by abrading with diamond paste and sandpaper, to promote nucleation as a foundation for the growth of a continuous polycrystalline diamond layer, or the like. This disadvantageously increases processing costs and the time for forming the diamond layer. Also, the formation of the diamond layer is restricted to those areas of the substrate where the nucleation layer has been adequately formed.

It will be appreciated that, in accordance with this aspect of the present invention, the process for creating a nucleation layer on the substrate is integrated into the same system and is integral with the process for forming the diamond coating over the substrate.

In accordance with this aspect of the invention, a tungsten-halogen lamp array 138 is disposed beneath the quartz window 133 and is used to uniformly radiantly heat the substrate and the substrate holder 124.

This aspect of the invention contemplates the use of any material for the window. The important factor is that the window is transparent to a source of synergistic stimulation having a predetermined wavelength for forming a nucleation layer on the surface of the substrate. In a preferred embodiment the source of synergistic stimulation is a lamp array 138.

Window 133 enables the lamp array 138 to advantageously heat the substrate from beneath at the same time that the plasma is impinging upon the target substrate from above. The transparent window 133 in combination with the lamp array 138 provide a means for facilitating the creation of a nucleation layer on the target substrate. Epitaxial, polycrystalline, and amorphous growth of a substance such as diamond can then occur at a much faster rate on top of the nucleation layer. A nucleation layer can be made by chemical vapor deposition on top of the target substrate by such materials as, for example, boron carbide, silicon carbide, aluminum nitrite, aluminum carbide, germanium carbide, and others. The nucleation layer is quickly grown due to the irradiation of the target substrate by the lamp array 138 through the transparent window 133. The easily created nucleation layer has been found to enhance the growth of a diamond layer which is then deposited on top of the nucleation layer.

It will be appreciated that this aspect of the invention, in combination with other features of the invention described herein, makes possible epitaxial growth of a diamond layer on the substrate, as well as polycrystalline or amorphous growth of a diamond layer. Epitaxial, polycrystalline or amorphous growth of other substances for semiconductor device applications are also possible using the present invention.

Figure 3:
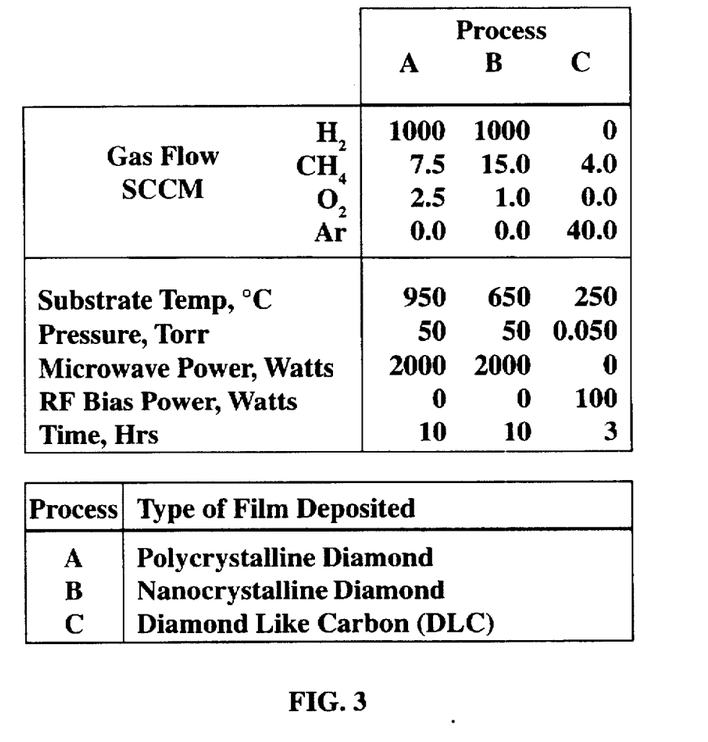
FIG. 3 is a chart showing process conditions for producing different types of diamond coating using the present invention.

FIG. 3 shows a summary of process conditions for various types of a diamond coating produced in accordance with the present invention. For example, polycrystalline diamond layers, nanocrystalline diamond and diamond like carbon (DLC) are shown.

In accordance with one aspect of the present invention, a polycrystalline diamond layer can be deposited on an untreated silicon surface by first depositing a nanocrystalline diamond layer. This method does not rely on the use of a substrate bias and therefore is believed applicable to non-conducting substrates.

A turbomolecular pump was used to evacuate the process chamber to a typical base pressure of $1 \times 10^{-6}$ torr prior to each deposition run. Processes B and C can be used to deposit films on untreated polished silicon wafers. Process B followed by Process A results in the deposition of continuous polycrystalline diamond layers without any substrate preparation. Deposition conditions for process B are similar to those used to deposit polycrystalline diamond films (process A), with the exception that in process B the substrate surface is more distant from the plasma ball, resulting in less heating of the substrate by the plasma.

The use of the lamp array 138 to irradiate the target substrate from below is also advantageous because it has been found to be an extremely efficient way to heat the target substrate. Also, the irradiation of the target substrate by a lamp array 138 eliminates electrical interference which is often found in conventional methods employing inductive heating of the substrate. In conventional plasma enhanced CVD devices, power supplies must be carefully isolated from a substrate heated through inductive heating methods in order to prevent electrical interference and consequent irregularities in the formation of the epitaxial coating.

The detail of the upper portion of the process chamber including the antenna is described with reference to FIG. 2. The inner wall 140 of process chamber 114 forms a circular resonant cavity with the substrate holder 124. A substrate 142 is disposed upon the substrate holder 124 for contact with a plasma ball 144. In a preferred embodiment, the substrate holder 124 is moveable up and down in a vertical direction. The substrate holder 124 is preferably insulated and is connected with a computer driven stage to vary the distance from the plasma to the substrate as will be explained.

The upper portion of the process chamber 114 comprises a removable structure 150 suitably arranged to allow microwave radiation in the waveguide 104 to pass into the process chamber 114. The waveguide 104 is coupled to a window 154 which is constructed of a suitable microwave-transparent material such as quartz.

In accordance with one aspect of the present invention, antenna 106 comprises an antenna radiator rather than a conventional microwave coupler. The use of antenna radiator 106 provides a means for radiating an E field of maximized intensity at a transmitting end. This consequently also provides a means for optimal control of a plasma ball 144 such that the high intensity plasma ball 144 can be precisely directed to any point on a substrate with greater control and precision than was previously possible with conventional mode coupler devices.

It has been found that the strength of the E field associated with microwave radiation in the waveguide 104 is maximized in the center of waveguide 104. Since the wall is a conductor, the field at the wall is zero. In accordance with this aspect of the invention, an antenna 106 has a first receiving end disposed substantially in the center of waveguide 104 and transversely to the longitudinal axis of the waveguide 104. The E field is oscillated in the conductive waveguide 104 by adjusting three stub tuner 108 in accordance with known techniques such that it attains a frequency characterized by maximized propagation and intensity for a desired mode, for example a $TE_{10}$ mode. The E field then oscillates in the antenna 106. A transmitting end of antenna 106 is provided as a means for radiating the E field with maximized intensity into the process chamber 114.

Antenna 106 is disposed generally orthogonally within waveguide 104 and passes into the chamber defined by quartz window 154. It will be appreciated that quartz window 154 and antenna 106 both extend into the process chamber 114. In a preferred embodiment, antenna 106 is disposed below the level of the upper inner wall 104 of the process chamber 114. Antenna 106 thus directs the maximum E field from the waveguide 104 so that a plasma forms above the substrate holder 124 which is attached to the movable quartz ring support fixture 118.

Figure 4:
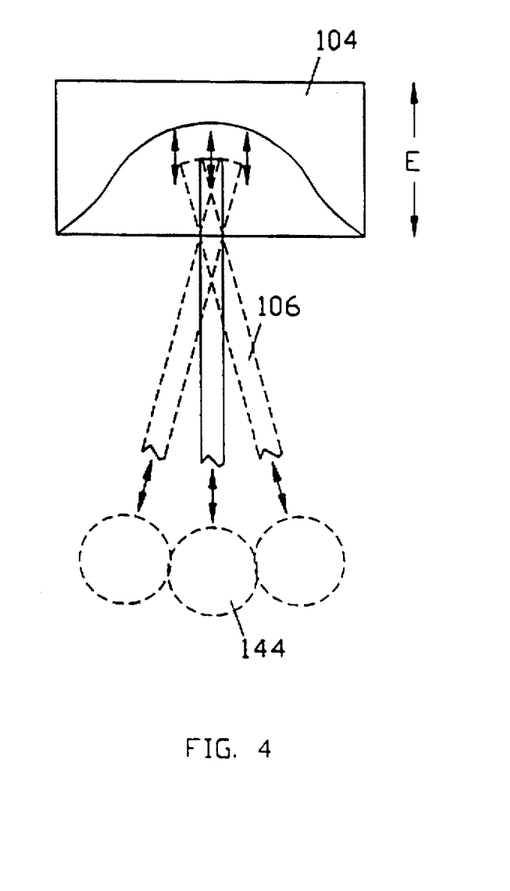
FIG. 4 shows an electric field pattern inside a rectangular waveguide which is coupled by a swiveling antenna into a process chamber in accordance with one aspect of the present invention.

In accordance with the foregoing aspect of the invention, a $TE_{10}$ mode is transmitted from microwave generator 100 into rectangular waveguide 104. The electric field pattern inside waveguide 104 is shown in FIG. 4.

The antenna 106 couples the maximum oscillating E field inside waveguide 104 into a circular waveguide 111. The oscillating E field is radiated from the end of antenna 106 into the resonant cavity formed by the chamber walls 140 and the substrate platen 124.

The maximum E field inside the resonant cavity is actually a distance away from the window 154. Therefore, the plasma 144 does not contact the window 154. Furthermore, it has been found that the maximum E field will follow the vector pointing from the antenna. Therefore, the plasma 144 will follow the direction of the antenna 106 when the antenna 106 is swivelled about an axis of rotation formed by the ball joint 182 and socket member 184. Alternatively, it will be appreciated that the ball joint 182 and socket member 184 form an axis of rotation or pivot axis. The coupling antenna 106 is then swingably moveable about the axis of rotation to direct the stable plasma 144 to move about the substrate surface. Also, antenna 106 may be simultaneously moved up and down in a vertical axis with respect to the substrate. This arrangement provides a coupling antenna 106 swingably moveable about an axis of rotation with at least two degrees of freedom which directs a stable plasma 144 to move as directed at an optional point of contact about the substrate surface.

In accordance with another aspect of the invention, quartz window 154 behaves as a dielectric reflector. The dielectric reflector comprises an integral part of the microwave circuit and has been found to greatly influence the radiation of the microwave energy into the process chamber. In this regard, the position of tuning elements 108 and 112 are set to cancel reflected microwave power caused by dielectric reflector 154. This enables the dielectric reflector to closely control and to maximize the electric vector of the radiated microwave energy. The dielectric reflective properties of quartz window 154 have been found to provide a means for generating stability in the plasma ball 144.

The antenna 106 and quartz window 154 are cooled by forced air as shown by arrow 160. In a preferred embodiment, a cooling passage is provided though the core of antenna 106 along its longitudinal axis for the infusion of compressed air. Compressed air cools the inside of antenna 106 and is also directed against the quartz window 154 as shown by the arrows.

The process of igniting the gases to form the plasma is well-known. Generally, the microwave power from the antenna 106 is transferred to electrons and the gas is ignited producing a plasma in the region existing all over the cross-section of the process chamber 114. At the optimum gas pressure range, a dense plasma is produced locally near the substrate surface and located distant from the quartz window 154. In accordance with the present invention, it has been found that the direction and location of the plasma ball can be closely controlled by pivoting or swiveling the coupling antenna about a desired axis of rotation. Also, it has been found that the substrate holder can be moved in a Z axis or vertical direction without disturbing the resonance of the microwave cavity. In a preferred embodiment, plasma to substrate distance is changed by moving the substrate holder 124 in a Z axis or up and down with respect to the antenna 106 which scans the plasma in an X-Y plane. Thus, the plasma to substrate distance can be closely controlled.

In accordance with techniques which are well-known, microprocessor controller 172 is preprogrammed to scan antenna 106, so as to move the plasma ball 144 to provide a uniform coating of diamond or other material over the surface of substrate 142. The microprocessor controller 172 is also connected with computer driven stage 195 which includes actuator means for moving the substrate holder 124 in a vertical direction with respect to the plasma as will be explained. Plasma to substrate distance thus can be optimized over the entire surface of a substrate.

Sensor means are provided for optimizing the thickness of the diamond coating or the like over the surface of the substrate 142 being coated. Such sensors, for example, are charge-coupled devices (CCDs), which have low noise and are capable of high-resolution imaging. It is also possible to use any convenient means for scanning a locus of points defining the surface of the substrate to be coated.

Figure 2:
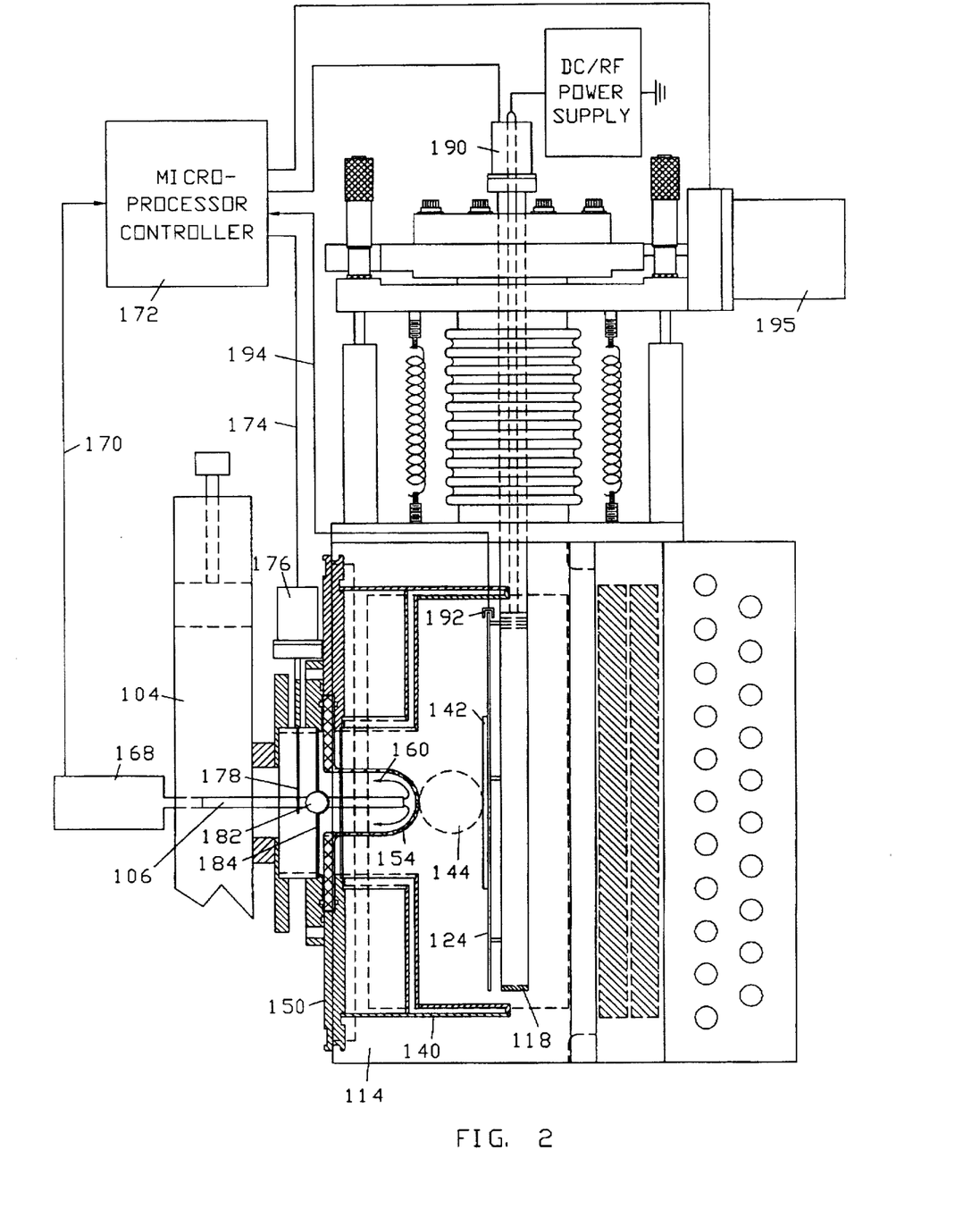
FIG. 2 is an enlarged side view of the embodiment depicted in FIG. 1.

In a preferred embodiment, an optical based thin film sensor means 168 is disposed for looking through the axis of antenna 106 as shown in FIG. 2. The sensor means 168 is, for example, a charge-coupled device (CCD). The sensor means 168 provides high resolution imaging of the surface of the substrate 142 in accordance with techniques which are well known. The sensor means 168 is thus able to measure the thickness of the deposited film over substrate 142 with extreme accuracy. Sensor means 168 is adapted for producing output signals to microprocessor 172 over line 170. The output signals produced along line 170 to the microprocessor 172 are representative of the precise thickness of the coating to being applied to the substrate surface. The microprocessor then uses these signals in a feedback control configuration, in accordance with techniques which are well known to those skilled in the art, to automatically calculate the angle of inclination of the antenna 106 and degree of upward or downward movement of the substrate holder 124 for the locus of points which define the optimal contact between the plasma 144 and the substrate 142. This provides a coating of uniform thickness over the entire area of the substrate.

In a preferred embodiment, the microprocessor controller 172 analyzes the incoming signals from the sensor 168 and produces a first set of control signals on output lead 174 to an actuator mechanism 176. The actuator mechanism includes an arm 178 operatively connected to the antenna 106. A single spherical ball 182 and corresponding mating surface 184 are disposed around the periphery of the antenna 106 at a given point. The arm 178 of actuator mechanism 176 rotates the antenna 106 about a desired axis of rotation in response to a first control signal from microprocessor controller 172. The axis of rotation of the antenna can be varied by changing the angle at which the antenna projects into the process chamber through the spherical ball.

The antenna is swiveled about an axis of rotation defined by spherical ball 182. The angle of rotation also can be controllably selected so that the antenna can be swiveled about a selectively larger or smaller area.

The microprocessor produces a first set of signals along output leads to the actuator mechanism 176 which are representative of the degree to which the actuator mechanism 176 is to move the angle of inclination of the antenna 106 for each mapped point in the locus of points defining the target surface of a given substrate. The antenna 106 is capable of being swiveled about a pivot axis with at least two degrees of freedom. It will be appreciated that the antenna 106 can be rotated, swiveled and pivoted in order to make the plasma ball scan the entire surface of a substrate.

In response to a second set of control signals from the microprocessor 172, the substrate holder 124 moves the substrate 142 upward or downward with respect to the plasma. A second set of signals are sent by the microprocessor over line 196 to computer driven stage 195. The signals are representative of the degree to which the computer driven stage 195 is to move the substrate holder 124 either downward or upward with respect to each point in the locus of points which define the substrate surface in order to maintain a uniform coating over that surface.

The computer driven stage 195 includes an electrically actuable means for moving the substrate holder 124 in precise positional increments in a vertical direction with respect to antenna 106 in accordance with techniques which are well known.

The foregoing features of the invention advantageously enable the plasma ball to be automatically directed in predetermined contact with a larger surface area of the target substrate than was previously possible. In addition, the foregoing features of the present invention enable the antenna to automatically direct the plasma ball to scan any type of surface at a predetermined uniform contact.

It will be appreciated that the present invention enables surfaces which are non-uniform and nonplanar to be provided with a uniform coating of a thin film diamond or other substance because the plasma ball is automatically directed by the microprocessor controller and sensors to be conformably directed to the target substrate surface and to maintain a uniform, predetermined distance from that surface. This enables a plasma CVD device according to the present invention to provide a coating of uniform thickness over any substrate surface. This provides a great advantage over conventional plasma enhanced CVD devices which are incapable of coating a nonplanar substrate surface with a thin film layer having a uniform thickness.

A device according to the present invention is capable of optimizing the plasma to substrate distance over a greater area than was previously possible. In addition, the plasma to substrate distance is also optimized for nonplanar substrates. This achieves a much higher coating rate for a thin film layer of uniform thickness than was previously possible. For example, in conventional ECR plasma enhanced CVD devices, a 2–6 inch wafer surface was about the largest surface capable of being coated with a thin film layer. However, the surface coating was by no means uniform. For example, a conventional ECR plasma CVD device typically provides a uniform coating over only 1 $cm^2$. In contrast, a device according to the present invention is capable of coating a 4 inch wafer (approximately 75 $cm^2$). Thus, the present invention is capable of increasing, by at least two orders of magnitude, the surface area of a substrate which can be coated with a layer of uniform thickness using a plasma enhanced CVD process.

It should be noted that the present invention is not limited to producing a diamond coating but can also be used for the deposition of any thin film such as silicon oxide, silicon nitride, gallium nitride, or the like.

While the present invention can be used for any type of epitaxial or thin film coating, it has great advantages in the application of a diamond coating. In a conventional CVD device using an electron cyclotron resonance (ECR) plasma, a diamond deposition is approximately equal to the plasma diameter. Because the RF coupling antenna in a conventional microwave plasma CVD device is fixed or a capable of varying only the vertical elevation with respect to the plasma, coating an area larger than the plasma diameter can be done only by repositioning the substrate. However, in conventional microwave plasma CVD devices, if the substrate holder or other substrate supporting means are moved relative to an antenna with a fixed angular position, the stability of the resonant cavity formed in the process chamber 114 is destroyed. This significantly limits the degree to which large area substrates can be uniformly coated using conventional plasma CVD devices.

Thus, in accordance with the present invention for multiple passes of the plasma ball 144 over a target substrate, the resonant cavity of the process chamber can be maintained substantially constant. This has been found to greatly enhance the uniformity of the deposition process. Some conventional large area deposition systems (LADS) claim to be capable of achieving twenty-five per cent uniformity of layer thickness over an area eight inches in diameter. In contrast, using the process of the present invention, it has been found that a uniformly thick coating can be achieved with variations of less than 10 percent.

Conventional feedback control methods enable the microprocessor 172 to keep the plasma ball 144 accurately positioned on the substrate to form a uniform thin film coating. A series of positional intervals along a surface of the substrate holder are established by an encoding strip or other convenient means for indicating precise positional movement. In a preferred embodiment, these intervals are 0.100" of an inch apart but could be any convenient distance. The intervals on the encoding strip correspond to precise positional intervals and are detected by a position encoding means 192. The position encoding means 192 senses the degree of rotation of the substrate holder 124. Position encoding means 192 then produces output signals along line 194 to the microprocessor controller 172 which are representative of the degree of rotation of the substrate holder 124. The microprocessor controller 172 provides feedback signals along line 174 to the actuator mechanism 176. The signals from the microprocessor along line 174 are representative of the degree to which the actuator mechanism 176 is to move the angle of inclination of the antenna 106 in order to maintain a uniform thin film coating on substrate 142, as the substrate holder 124 rotates.

The precise control achieved by the microprocessor controller 172 is accomplished through conventional feedback control methods which are well-known and can be implemented by one skilled in the art without undue experimentation.

Figure 5:
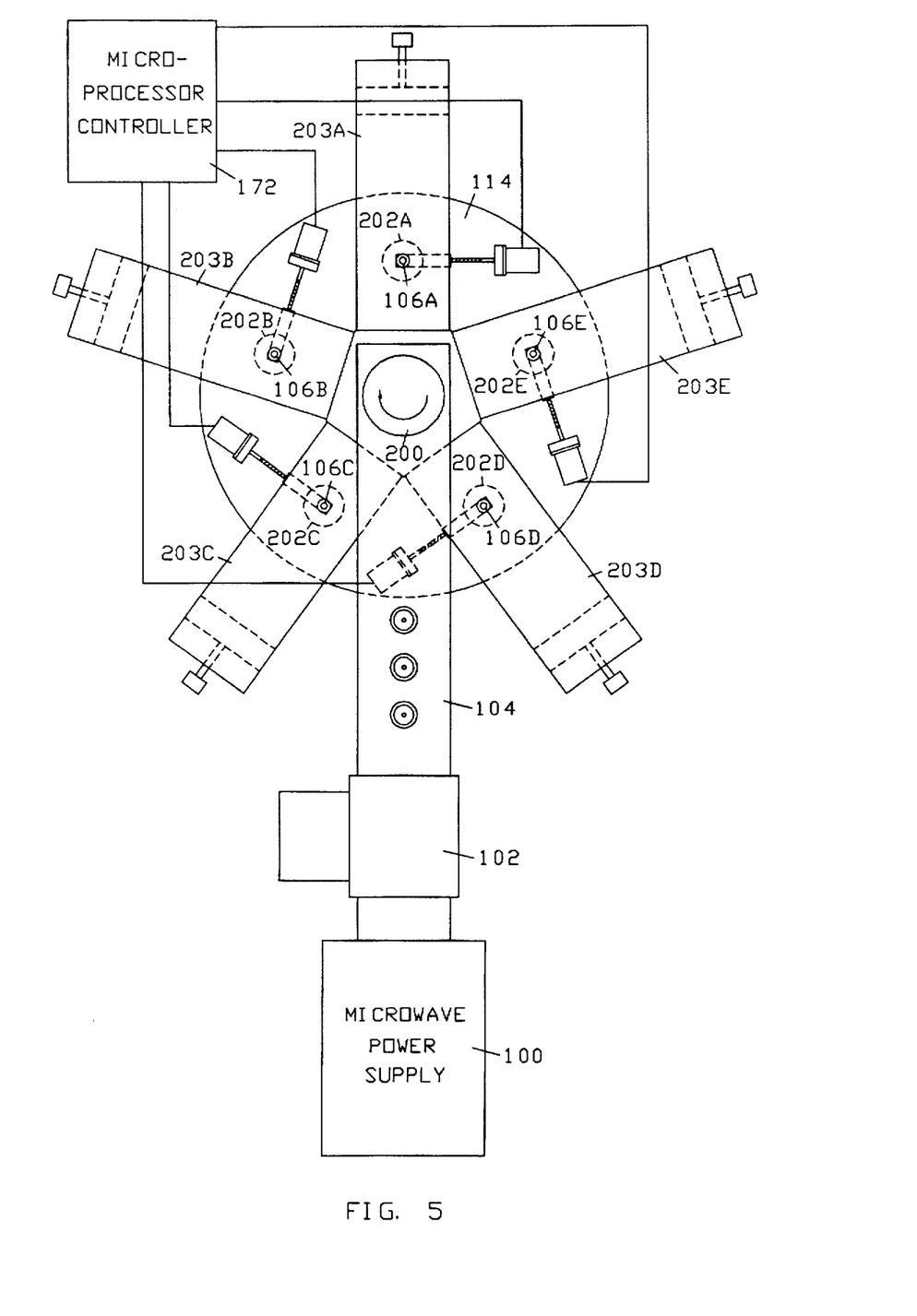
FIG. 5 shows an alternate embodiment of the present invention incorporating a plurality of antennas.

In accordance with another embodiment of the invention as shown in FIG. 5, a plurality of antennas are provided for controllably moving a corresponding plasma ignited at the transmitting end of each antenna, as described with reference to FIGS. 1 and 2. This has the advantage of covering even large area substrates with a uniform coating of diamond, refractory materials, or the like.

Referring to FIG. 5, a process chamber 114, as described in detail with reference to FIGS. 1 and 2, is provided with a plurality of antennas 106a, 106b, 106c, 106d, 106e. Each antenna 106a, 106b, 106c, 106d, 106e, is disposed for coupling microwave energy from a corresponding waveguide 203a, 203b, 2032c, 203d, 203e.

Each antenna 106a, 106b, 106c, 106d, 106e is disposed in coaxial arrangement within a corresponding dielectric reflector means 202a, 202b, 202c, 202d, 202e, respectively, as described above. The antennas 106a, ... 106e each have a transmitting end which terminates in a corresponding dielectric reflector 202a, ... 202e within process chamber 114 as shown in FIGS. 1 and 2, as described previously.

The antennas 106a, ... 106e are disposed substantially parallel to the direction of the E field vectors in a corresponding waveguide 203a, 203b, ... 203e for producing maximized coupling efficiency of the E fields into the process chamber 114. Microwave energy is supplied through a microwave generator 100, circulator 102 and rectangular waveguide 104 including a stub tuner, as previously described with reference to FIGS. 1 and 2.

The plurality of antennas 106a, ... 106e are also adapted to be swiveled about an axis of rotation with at least two degrees of freedom as described above. This optimizes contact between the substrate and a plurality of plasmas over a very large substrate area. The antennas are swiveled and moved with respect to the substrate in response to signals from a microprocessor controller as shown in FIG. 2, in accordance with techniques which are well known. As in the embodiment with a single antenna, the invention is adapted for operation in open loop or closed loop mode. In an open loop mode, a sequence of plasma to substrate contact paths for the plasma associated with each corresponding antenna is programmed into the microprocessor. The microprocessor then provides control signals to activate each antenna to direct the plasma in a predetermined contact with the sbustrate surface in accordance with known techniques.

In a closed loop mode a substrate having an irregular or geometrically complex surface is scanned by a CCD imaging means or other convenient sensor means for producing output signals representative of surface deviations. The microprocessor, in accordance with well known adaptive feedback techniques then activates selected antennas to move the plasma in an optimized contact path with the scanned portion of the substrate to provide the desired coating of diamond or refractory material.

It will be appreciated that the present invention provides a means for optimizing the position of the plasma ball with respect to the locus of points defining the surface of the substrate to be coated. Thus, the present invention provides an extremely reliable degree of repeatability for stabilizing the plasma ball with respect to substrate surfaces which are mapped in the microprocessor controller 172. The apparatus according to the present invention enables the plasma to be moved with a greater degree as to accuracy and repeatability over a wider area of the substrate than was previously possible with conventional methods. This advantageously increases speed and uniformity of a plasma enhanced CVD process.

The invention is particularly well-suited to diamond deposition. The surface area of diamond deposition is approximately equal to the plasma diameter. Accordingly, conventional methods which lack the present capability of swiveling the antenna in at least two degrees of freedom are seriously limited in the size of the substrate that can be coated. With conventional techniques, the substrate must be manually repositioned in order to increase the area of the diamond coating. During the repositioning, the plasma must be turned off. This greatly increases the complexity and the time needed for a conventional plasma enhanced CVD process.

In contrast, the present invention by pivoting the antenna about an axis of rotation in at least two degrees of freedom enables a diamond layer to be optimally coated over a much larger area with greater uniformity than was previously possible. In addition, the present invention greatly enhances the rate of diamond coating and the rate of other thin film epitaxial coatings such as for gallium arsenide.

It will be appreciated that the foregoing aspects of the present invention provide the advantages of generating a high energy microwave plasma with improved controllability for CVD processing. The present invention is capable of refractory material processing and is also suitable for chemical vapor infiltration. Thus, the present invention is also adapted for forming ceramics for high temperature applications.

While the invention has been described in connection with what is presently considered to be the most practical and preferred embodiments, it is to be understood that the invention is not limited to the disclosed embodiment and alternatives as set forth above, but on the contrary, is intended to cover various modifications and equivalent arrangements included within the spirit and scope of the appended claims.

What is claimed is:

1. A method for forming a thin film layer of material such as a diamond on a substrate surface, comprising the steps of:

coupling a source of microwave radiation into a process chamber with an antenna;

providing a reactant gas into said process chamber to be ignited by said microwave radiation to form said plasma;

swingably rotating said antenna about a pivot axis with respect to said substrate surface to move said plasma to a desired locus of points on said substrate surface;

moving said substrate in a vertical direction with respect to said antenna to optimize plasma to substrate contact over said substrate surface.

2. A method according to claim 1 wherein said step of swingably rotating said antenna about a pivot axis further includes the steps of:

imaging said substrate surface to determine an optimal path for scanning said plasma across said substrate surface and producing output signals representative of said imaged surface;

moving said antenna about a pivot axis with at least two degrees of freedom in response to said output signals to optimize plasma to substrate contact over said surface.

3. A method according to claim 2 further comprising the step of moving said substrate in a vertical direction with respect to said antenna in order to further optimize plasma to substrate contact on said substrate surface.

4. A method for using a CVD plasma to form a uniform coating of a material such as a diamond over the surface of a substrate comprising:

providing a stable resonant cavity for formation of a plasma;

holding a substrate in said resonant cavity for coating a surface thereof;

rotating a coupling antenna about a pivot axis with respect to said substrate for directing said plasma into optimal contact with said substrate surface.

5. A method according to claim 4 further comprising the step of moving said substrate in a vertical direction with respect to said antenna for optimizing the contact between said plasma and said substrate surface for forming a uniform layer of said material over said substrate surface.

6. A method according to claim 4 further including the steps of providing beneath said substrate a transparent window; and irradiating said substrate through transparent window to form a nucleation layer on said substrate surface.

7. A method for forming a thin film layer such as diamond or other material over a substrate surface comprising;

providing a process chamber having walls, a top and a base for forming a stable resonant cavity for formation of a plasma;

holding said substrate in a substrate holder disposed within said stable resonant cavity;

forming said plasma by coupling microwave radiation into said stable resonant cavity with a coupling antenna;

swiveling said coupling antenna about an axis of rotation to scan said plasma in an X-Y plane with respect to said substrate surface.

8. A method according to claim 7 further comprising the step of moving said substrate holder in a Z axis with respect to said X-Y plane for optimizing plasma to substrate contact.

9. A method of using a plasma CVD process for depositing a layer of material such as a diamond on a substrate surface comprising:

coupling a microwave source into a process chamber having a transparent base and a top and side walls for forming a stable resonant cavity;

holding a substrate in a substrate holder disposed in said stable resonant cavity;

irradiating said substrate through said base to form a nucleation layer on a surface of said substrate;

swiveling said coupling antenna about an axis of rotation in an X-Y plane to direct said plasma to maximum coverage of said substrate surface area;

moving said substrate in a Z axis relative to said X-Y plane to optimize plasma to substrate contact over said substrate surface.

10. A method for forming a thin film layer such as diamond or other material over a substrate surface comprising:

providing a process chamber having walls, a top and a base for forming a stable resonant cavity for formation of a plasma;

holding said substrate in a substrate holder disposed within said stable resonant cavity;

forming said plasma by coupling microwave radiation into said stable resonant cavity with a coupling antenna;

providing in said base of said process chamber a window transparent to a source of synergistic stimulation such as heat energy having a temperature sufficient to create a nucleation layer on said substrate surface; and applying said source of synergistic stimulation through said window to form said nucleation layer for enhancing the formation of said thin film layer of said substrate surface.

* * * * *